(12) United States Patent
Wu et al.

(10) Patent No.: US 8,461,654 B2
(45) Date of Patent: Jun. 11, 2013

(54) SPACER SHAPE ENGINEERING FOR VOID-FREE GAP-FILLING PROCESS

(75) Inventors: Ming-Yuan Wu, Hsin-Chu (TW);
Yi-Shien Mor, Hsin-Chu (TW);
Chih-Tang Peng, Taipei (TW);
Chiung-Han Yeh, Tainan (TW);
Kong-Beng Thei, Hsin-Chu (TW);
Harry Chuang, Singapore (SG);
Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/270,585

(22) Filed: Oct. 11, 2011

(65) Prior Publication Data

US 2012/0025329 A1 Feb. 2, 2012

Related U.S. Application Data

(63) Continuation of application No. 12/179,395, filed on Jul. 24, 2008, now Pat. No. 8,048,752.

(51) Int. Cl.
*H01L 29/78* (2006.01)
(52) U.S. Cl.
USPC .................. 257/411; 257/288; 257/E29.255
(58) Field of Classification Search
USPC ................................................. 257/288, 411
See application file for complete search history.

(56) References Cited

U.S. PATENT DOCUMENTS

| | | | |
|---|---|---|---|
| 5,516,729 A | 5/1996 | Dawson et al. | |
| 5,541,132 A | 7/1996 | Davies et al. | |
| 5,851,890 A * | 12/1998 | Tsai et al. | 438/303 |
| 6,144,071 A | 11/2000 | Gardner et al. | |
| 6,251,764 B1 | 6/2001 | Pradeep et al. | |
| 6,355,954 B1 * | 3/2002 | Gall et al. | 257/297 |
| 6,424,019 B1 | 7/2002 | Hsia et al. | |
| 6,632,714 B2 | 10/2003 | Yoshikawa | |
| 6,737,348 B2 | 5/2004 | Satake et al. | |
| 6,756,624 B2 | 6/2004 | Petrarca et al. | |
| 7,064,071 B2 | 6/2006 | Schwan | |
| 7,183,199 B2 | 2/2007 | Liu et al. | |
| 7,285,841 B2 | 10/2007 | Yoshida et al. | |
| 7,495,280 B2 | 2/2009 | Lo | |
| 2001/0010962 A1 | 8/2001 | Chen et al. | |
| 2003/0011080 A1 | 1/2003 | Deshpande et al. | |
| 2003/0020111 A1 | 1/2003 | Bevan | |

(Continued)

FOREIGN PATENT DOCUMENTS

| | | |
|---|---|---|
| CN | 1319881 A | 10/2001 |
| CN | 1463045 A | 12/2003 |
| CN | 1846313 A | 10/2006 |
| CN | 101170066 A | 4/2008 |

OTHER PUBLICATIONS

Augendre, E., et al., "Thin L-Shaped Spacers for CMOS Devices," IEEE, 2003, pp. 219-222.

*Primary Examiner* — Alexander Ghyka
(74) *Attorney, Agent, or Firm* — Slater & Matsil, L.L.P.

(57) ABSTRACT

A method of forming a semiconductor device includes providing a semiconductor substrate; forming a gate stack on the semiconductor substrate; forming a gate spacer adjacent to a sidewall of the gate stack; thinning the gate spacer; and forming a secondary gate spacer on a sidewall of the gate spacer after the step of thinning the gate spacer.

15 Claims, 13 Drawing Sheets

U.S. PATENT DOCUMENTS

| | | |
|---|---|---|
| 2004/0161919 A1 | 8/2004 | Cha et al. |
| 2004/0212009 A1 | 10/2004 | Wang et al. |
| 2005/0059228 A1 | 3/2005 | Bu et al. |
| 2005/0064722 A1 | 3/2005 | Hsu et al. |
| 2005/0266639 A1 | 12/2005 | Frohberg et al. |
| 2006/0102955 A1 | 5/2006 | Chen et al. |
| 2006/0151840 A1 | 7/2006 | Maekawa |
| 2006/0205169 A1 | 9/2006 | Yoon et al. |
| 2006/0220152 A1 | 10/2006 | Huang et al. |
| 2007/0023822 A1 | 2/2007 | Sung et al. |
| 2007/0122958 A1 | 5/2007 | Fang |
| 2007/0218633 A1 | 9/2007 | Prinz et al. |
| 2007/0267678 A1 | 11/2007 | Lo |
| 2009/0127632 A1 | 5/2009 | Pas |
| 2009/0286384 A1 | 11/2009 | Wu et al. |
| 2010/0022061 A1 | 1/2010 | Wu et al. |
| 2011/0227189 A1 | 9/2011 | Wu et al. |

\* cited by examiner

SPACER SHAPE ENGINEERING FOR VOID-FREE GAP-FILLING PROCESS

This application is a continuation of U.S. patent application Ser. No. 12/179,395, filed on Jul. 24, 2008, and entitled "Spacer Shape Engineering for Void-Free Gap-Filling Process," which application is incorporated herein by reference.

TECHNICAL FIELD

This invention relates generally to semiconductor devices, and more particularly to structures and manufacturing methods of metal-oxide-semiconductor (MOS) devices with improved gap-filling.

BACKGROUND

The scaling of VLSI circuits is a constant effort. Smaller integrated circuits allow more devices to be formed in one semiconductor chip. Additionally, power consumption and performance are also improved. With circuits becoming smaller and faster, however, the distance between devices decreases. The gap-filling between neighboring devices thus suffers from problems. The gap-filling problem may be explained using FIGS. 1A through 1D. Referring to FIG. 1A, gate stacks 4 and 14 are formed close to each other. Gate spacers 6 and 16 are formed on sidewalls of gate stacks 4 and 14, respectively. Referring to FIG. 1B, gate spacers 6 and 16 are thinned, so that their thickness T1 as shown in FIG. 1A is reduced to thickness T1' as in FIG. 1B. In FIG. 1C, contact etch stop layer (CESL) 8 is formed over gate stacks 4 and 14, wherein CESL 8 extends into gap 5 between gate stacks 4 and 14. Next, as shown in FIG. 1D, dielectric material 18 is formed to fill gap 5.

During the step shown in FIG. 1B, the thinning of gate spacers 6 and 16 causes the reduction of the aspect ratio of gap 5, wherein the aspect ratio of gap 5 may be defined as the ratio of height H to width W. Accordingly, in the structure shown in FIG. 1D, better gap-filling can be achieved. However, with the further reduction of the scale of integrated circuits, the aspect ratio of gap 5 continuously rises. Accordingly, even with the thinning of gate spacers 6 and 16, voids 19 may still form in dielectric material 18. Particularly, for gate-last approaches, hard masks are formed on gate stacks, causing the increase of height H of the gate stacks 4 and 14. This further causes the aspect ratio of gap 5 to be increased. Accordingly, a new method for forming MOS devices with improved gap-filling ability is needed.

SUMMARY OF THE INVENTION

In accordance with one aspect of the present invention, a method of forming a semiconductor device includes providing a semiconductor substrate; forming a gate stack on the semiconductor substrate; forming a gate spacer adjacent to a sidewall of the gate stack; thinning the gate spacer; and forming a secondary gate spacer on a sidewall of the gate spacer after the step of thinning the gate spacer.

In accordance with another aspect of the present invention, a method of forming a semiconductor device includes providing a semiconductor substrate; forming a gate stack on the semiconductor substrate; forming a seal layer on a sidewall of the gate stack; forming a lightly-doped source/drain region in the semiconductor substrate; forming a gate spacer on a sidewall of the seal layer; forming a source/drain region having an inner edge substantially aligned with an outer edge of the gate spacer; forming a source/drain silicide region on the source/drain region; thinning the gate spacer after the step of forming the source/drain region and the source/drain silicide region; and forming a secondary gate spacer on a sidewall of the gate spacer after the step of forming the source/drain silicide region, wherein the secondary gate spacer has a top edge lower than a top edge of the gate spacer.

In accordance with yet another aspect of the present invention, a method of forming a semiconductor device includes providing a semiconductor substrate; forming an insulation region having at least a portion in the semiconductor substrate; forming a first and a second gate stack on the semiconductor substrate, wherein the first and the second gate stacks are located adjacent to each other, and the second gate stack is over the insulation region; forming a lightly-doped source/drain region adjacent to the first gate stack; forming a first and a second gate spacer adjacent to sidewalls of the first and the second gate stacks, respectively; forming a source/drain region having an inner edge substantially aligned with an outer edge of the first gate spacer; forming a source/drain silicide region on the source/drain region; after the step of forming the source/drain region and the source/drain silicide region, thinning the first and the second gate spacers; after the step of thinning the first and the second gate spacers, forming a first and a second secondary gate spacer on sidewalls of the first and the second gate spacers, respectively; forming a contact etch stop layer (CESL) over the first and the second gate stacks and the source/drain silicide region; and filling a dielectric material into a gap between the first and the second gate spacers, wherein the dielectric material is over the CESL.

In accordance with yet another aspect of the present invention, a semiconductor device includes a semiconductor substrate; a gate stack on the semiconductor substrate; a gate spacer adjacent a sidewall of the gate stack; a source/drain region adjacent the gate spacer; a source/drain silicide region on the source/drain region, wherein the source/drain silicide region has an inner edge spaced apart from an outer edge of the gate spacer; and a secondary gate spacer having at least a portion horizontally between the inner edge of the source/drain silicide region and the outer edge of the gate spacer. The secondary gate spacer has a top edge lower than a top edge of the gate spacer. Further, the secondary gate spacer has an outer edge vertically misaligned to the inner edge of the source/drain silicide region.

In accordance with yet another aspect of the present invention, a semiconductor device includes a semiconductor substrate and a gate stack on the semiconductor substrate. The gate stack includes a gate dielectric including a planar bottom portion and sidewall portions; and a gate electrode on the planar bottom portion of the gate dielectric and adjoining the sidewall portions of the gate dielectric. The semiconductor device further includes a gate spacer adjacent a sidewall of the gate stack; a source/drain region adjacent the gate spacer; a source/drain silicide region on the source/drain region, wherein the source/drain silicide region has an inner edge spaced apart from an outer edge of the gate spacer; and a secondary gate spacer having at least a portion horizontally between the inner edge of the source/drain silicide region and the outer edge of the gate spacer. The secondary gate spacer has a top edge lower than a top edge of the gate spacer.

The advantageous features of the present invention include improved gap-filling, particularly for small-scale integrated circuits.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming metal-oxide-semiconductor devices and filling the gaps therebetween is provided. The intermediate stages of manufacturing a preferred embodiment of the present invention are illustrated. The variations of the preferred embodiments are then discussed. Throughout the various views and illustrative embodiments of the present invention, like reference numbers are used to designate like elements.

Figure 1A:
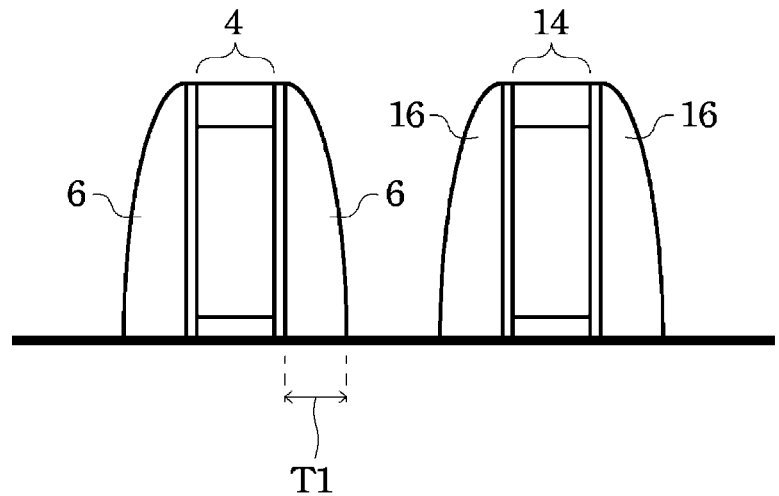
FIGS. 1A through 1D illustrate a conventional gap-filling process.
Figure 1B:
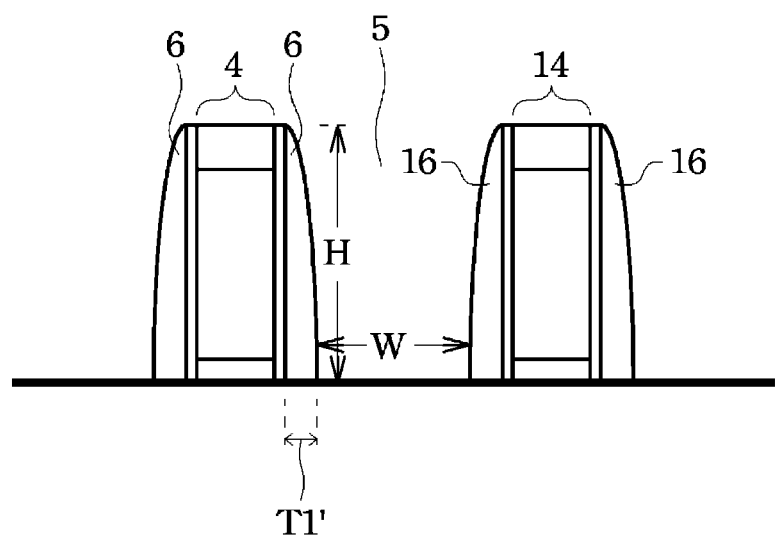
Figure 1C:
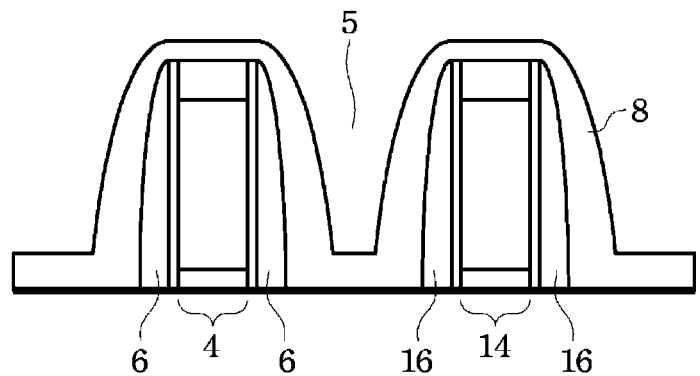
Figure 1D:
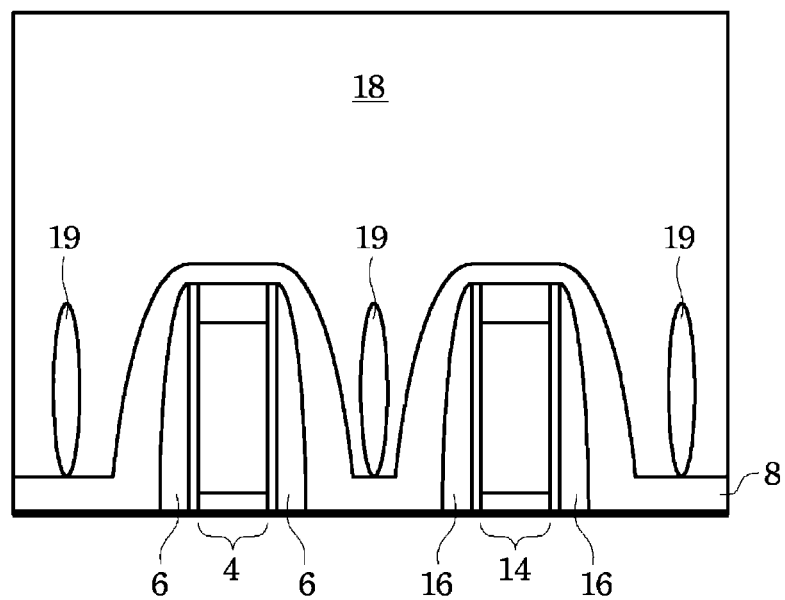
Figure 2:
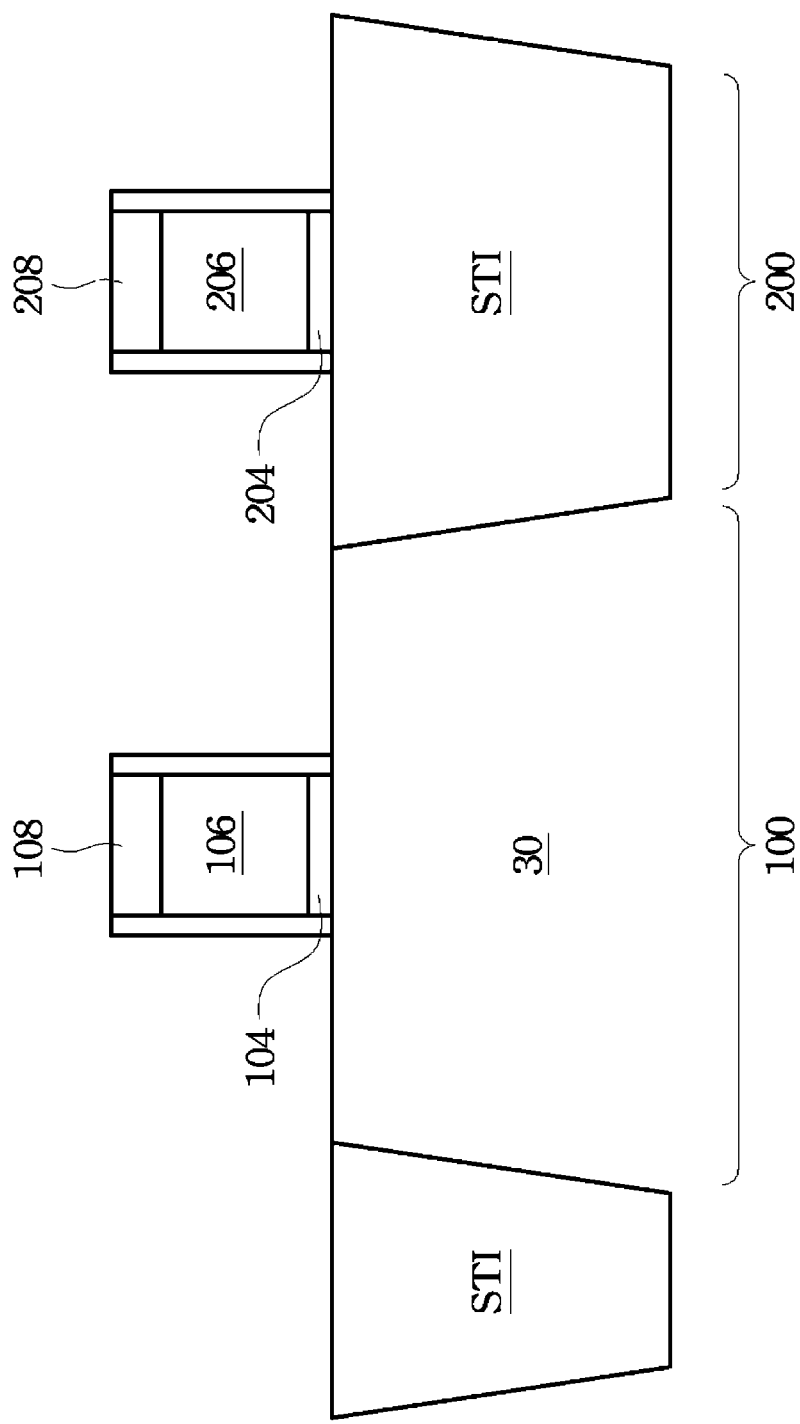
FIGS. 2 through 11 are cross-sectional views of intermediate stages in the manufacturing of an embodiment of the present invention, wherein a gate-last approach is used.
Figure 11:
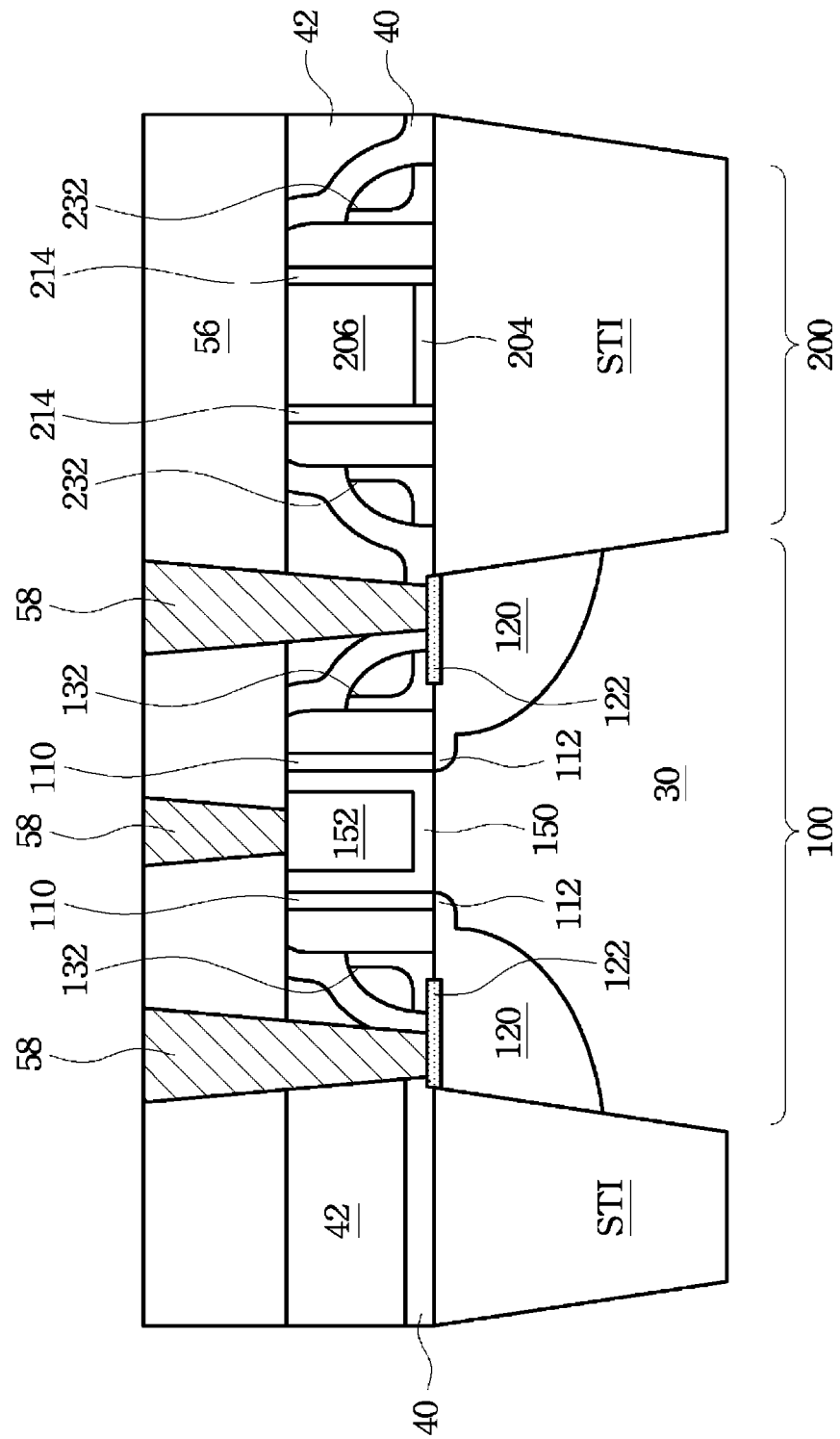
Figure 12:
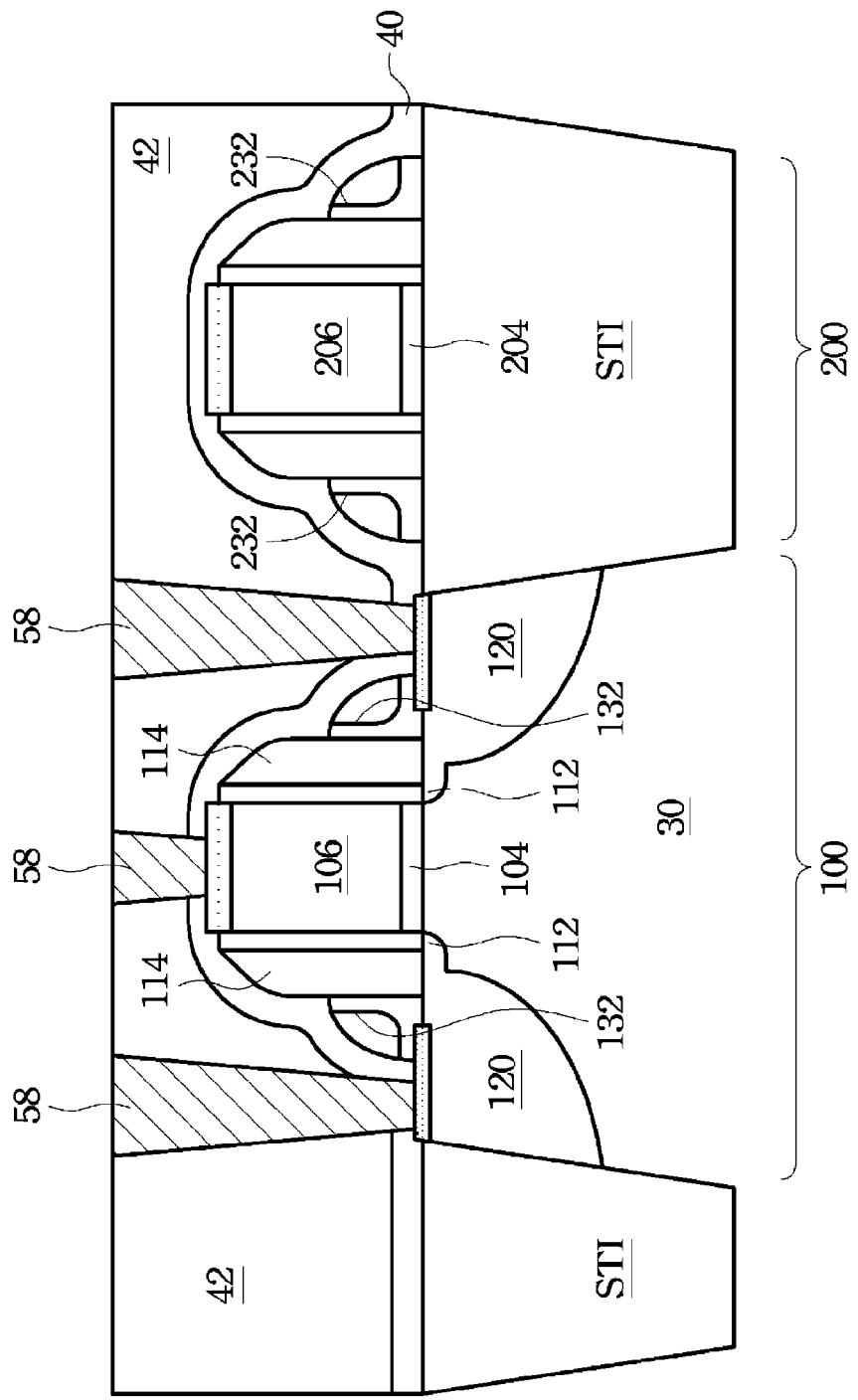
FIG. 12 illustrates an embodiment formed using a gate-first approach.

Referring to FIG. 2, substrate 30 is provided. Substrate 30 includes regions 100 and 200 adjacent to each other. In an embodiment, region 100 is for forming a MOS device, while region 200 is for forming a dummy gate electrode, often referred to as a dummy poly. The dummy poly may, or may not, be connected to the gate electrode of another MOS device. Alternatively, regions 100 and 200 are used to form MOS devices sharing a common source region or a common drain region, wherein each of the MOS devices may be essentially the same as the MOS device formed in region 100, as shown in FIG. 11 or 12. Shallow trench isolation (STI) regions are formed in substrate 30. In the exemplary embodiment discussed in the following paragraphs, device region 200 is for running a dummy poly, and hence an STI region may be formed in region 200. Device regions 100 and 200 are next to each other. Substrate 30 is preferably bulk silicon, but other commonly used materials and structures, such as SiGe, silicon on insulator (SOI), SiGe on insulator, or the like, can also be used. A gate stack including gate dielectric 104 and gate electrode 106 is formed in region 100. Similarly, a (dummy) gate stack including gate dielectric 204 and gate electrode 206 is formed in region 200. As is known in the art, gate dielectrics 104 and 204 are formed of dielectric materials such as silicon oxide, silicon nitride, high-k materials, or the like. Gate electrodes 106 and 206 may be formed of polysilicon or other commonly used conductive materials such as metals, metal nitrides, metal silicides, or the like. Optionally, hard masks 108 and 208 are on the top of the gate stacks, wherein hard masks 108 and 208 may be formed of silicon nitride.

Figure 3:
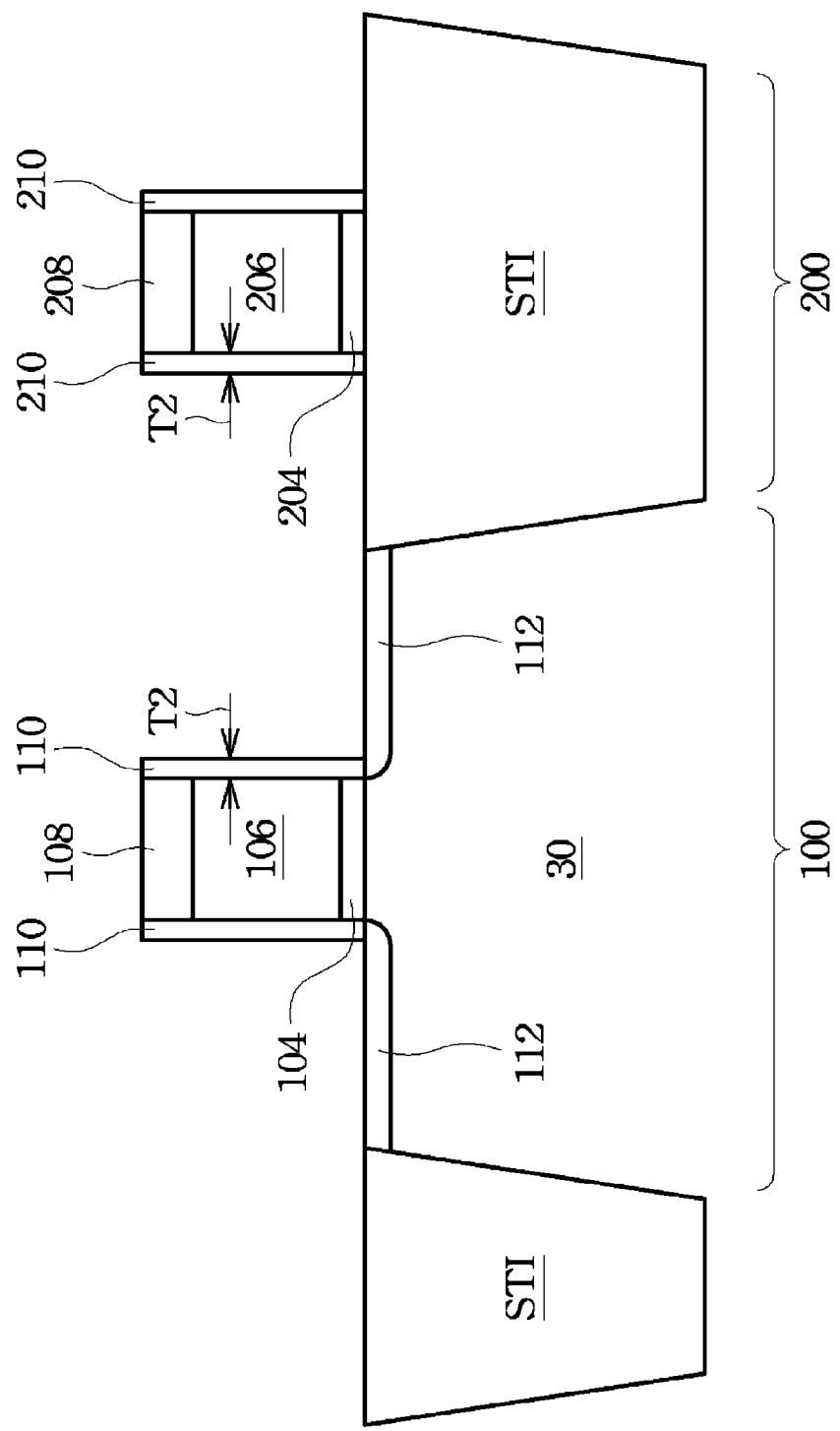

Referring to FIG. 3, seal layers 110 and 210 are formed. In an embodiment, seal layers 110 and 210 are formed of silicon nitride. The thickness T2 of seal layers 110 and 210 is preferably less than about 40 Å. It is realized, however, that the dimensions recited throughout the description are merely examples, and may be changed if different formation technologies are used. Seal layers 110 and 210 may be formed by blanket depositing a dielectric layer and patterning the dielectric layer, for example, using dry etching. With a small thickness, seal layers 110 and 210 have substantially no horizontal portions.

As also shown in FIG. 3, after the formation of seal layers 110 and 210, lightly-doped drain/source (LDD) regions 112 are formed by implantations. Region 100 may be implanted with an n-type impurity or a p-type impurity, depending on the type of MOS device to be formed. Pocket regions (not shown) may also be formed by implantations, wherein the pocket regions have an opposite conductivity type as LDD regions 112.

Figure 4:
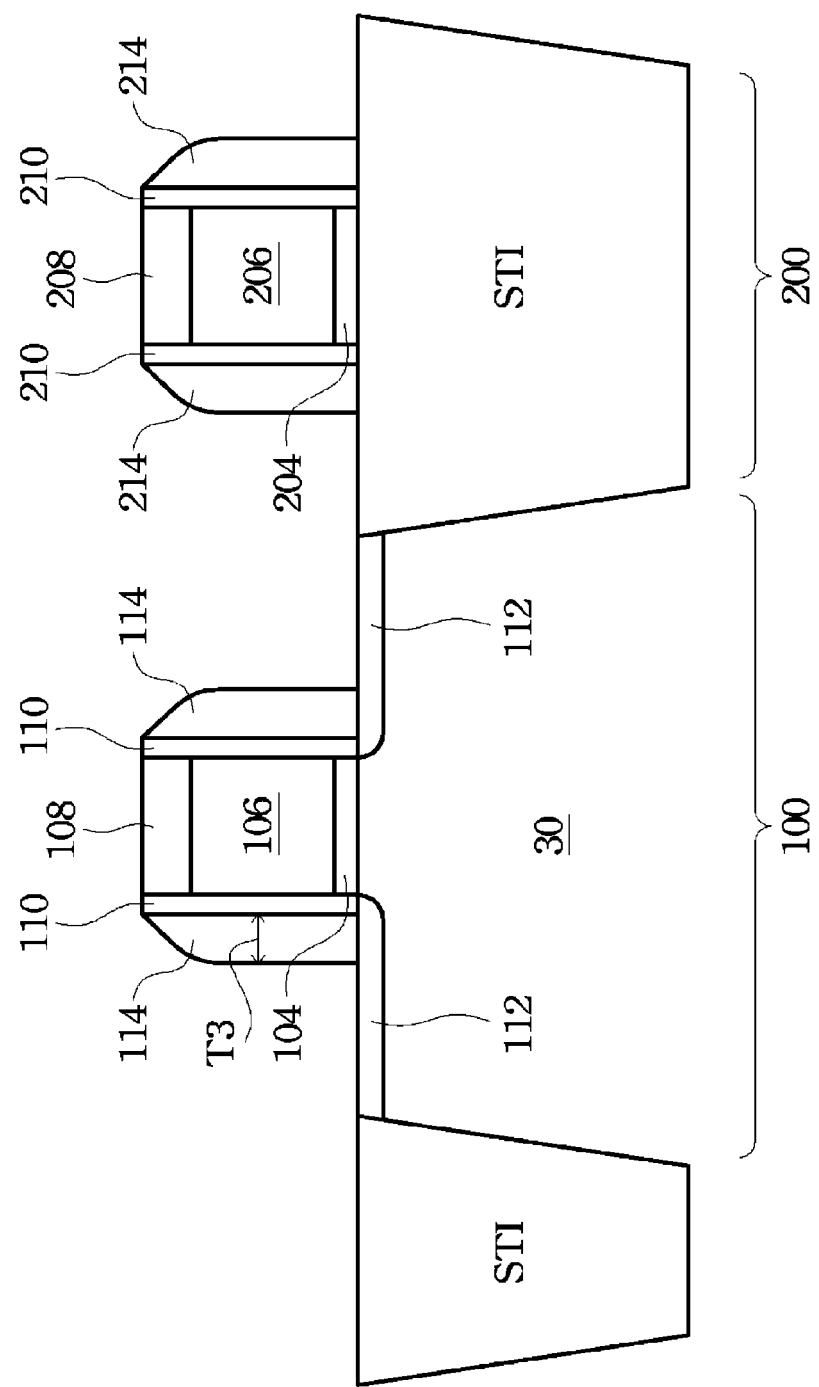

FIG. 4 illustrates the patterning of gate spacers 114 and 214. Preferably, a dielectric layer is formed, followed by an etch step to form gate spacers 114 and 214. The dielectric layer may be dry etched to form gate spacers 114 and 214. In an exemplary embodiment, the thickness T3 of gate spacers 114 and 214 is about 340 Å. The gate-last approach may be used to form the gate of the MOS device, as will be discussed in detail in subsequent paragraphs. Accordingly, the dielectric layer, and hence gate spacers 114 and 214, is formed of a single layer of silicon nitride, although the dielectric layer can be a composite layer comprising two layers or more, each formed of a material different from that of the other layers. In an alternative embodiment, a gate-first approach will be used, and hence the dielectric layer may be a composite layer, and may include, for example, a silicon nitride layer on a silicon oxide liner.

Figure 5:
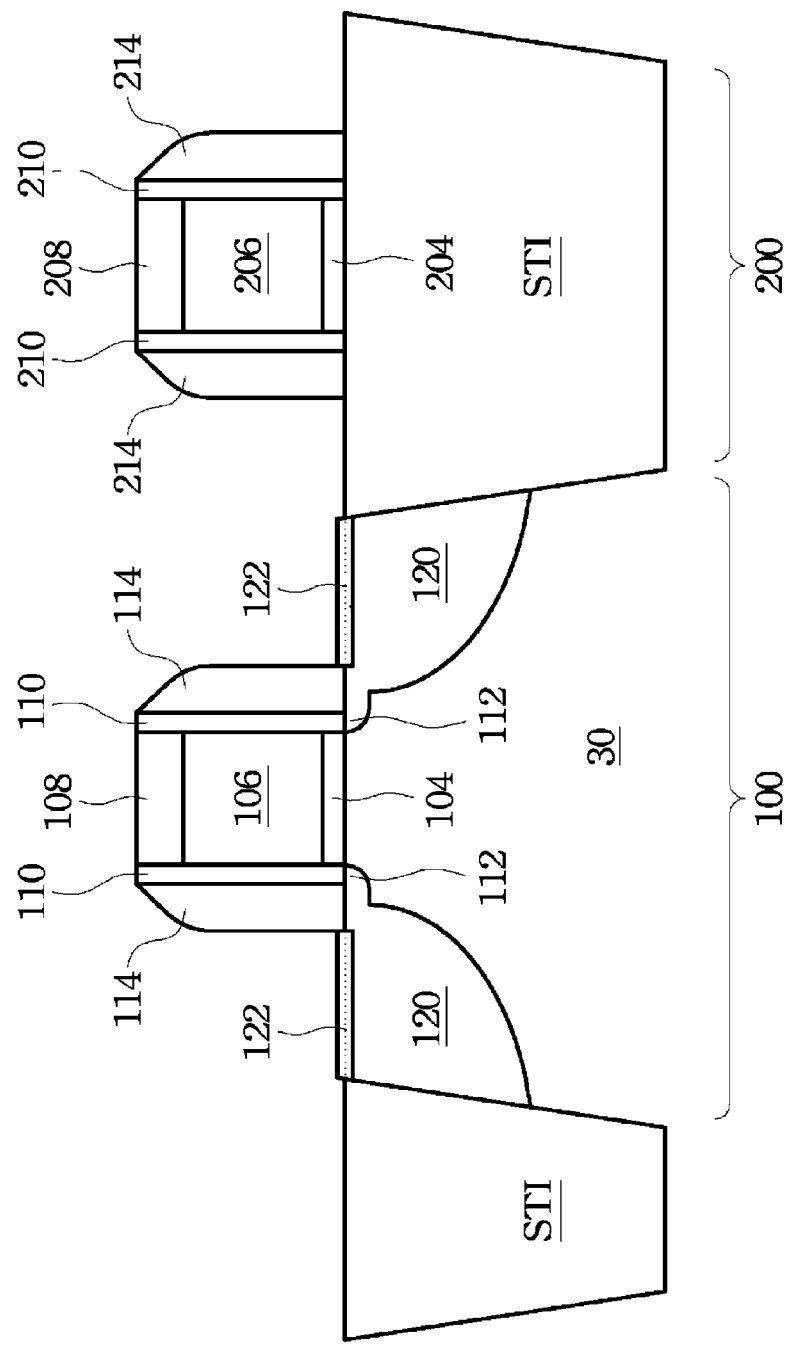

FIG. 5 illustrates the formation of source/drain regions 120. In the preferred embodiment, source/drain regions 120 are formed by implanting impurities into semiconductor substrate 30, and hence the inner edges of source/drain regions 120 are substantially aligned to the outer edges of gate spacers 114. The formation of source/drain regions 120 is known in the art, and hence the details are not repeated herein. Also, the formation of source/drain regions 120 may include forming recesses (not shown) along the outer edges of gate spacers 114, and filling the recesses with semiconductor stressors, for example, silicon germanium or silicon carbon, depending on the conductivity type of the MOS device.

FIG. 5 also illustrates the formation of silicide regions 122. As is known in the art, silicide regions 122 may be formed on the source/drain regions 120 by a salicide process. To form a silicide layer, a metal layer is formed by blanket depositing a thin layer of metal, such as cobalt, nickel, titanium, or the like, over the device. The respective wafer, in which the structure shown in FIG. 5 is formed, is then annealed to form a silicide layer between the deposited metal and the underlying exposed silicon regions. Un-reacted metal is then removed.

Figure 6:
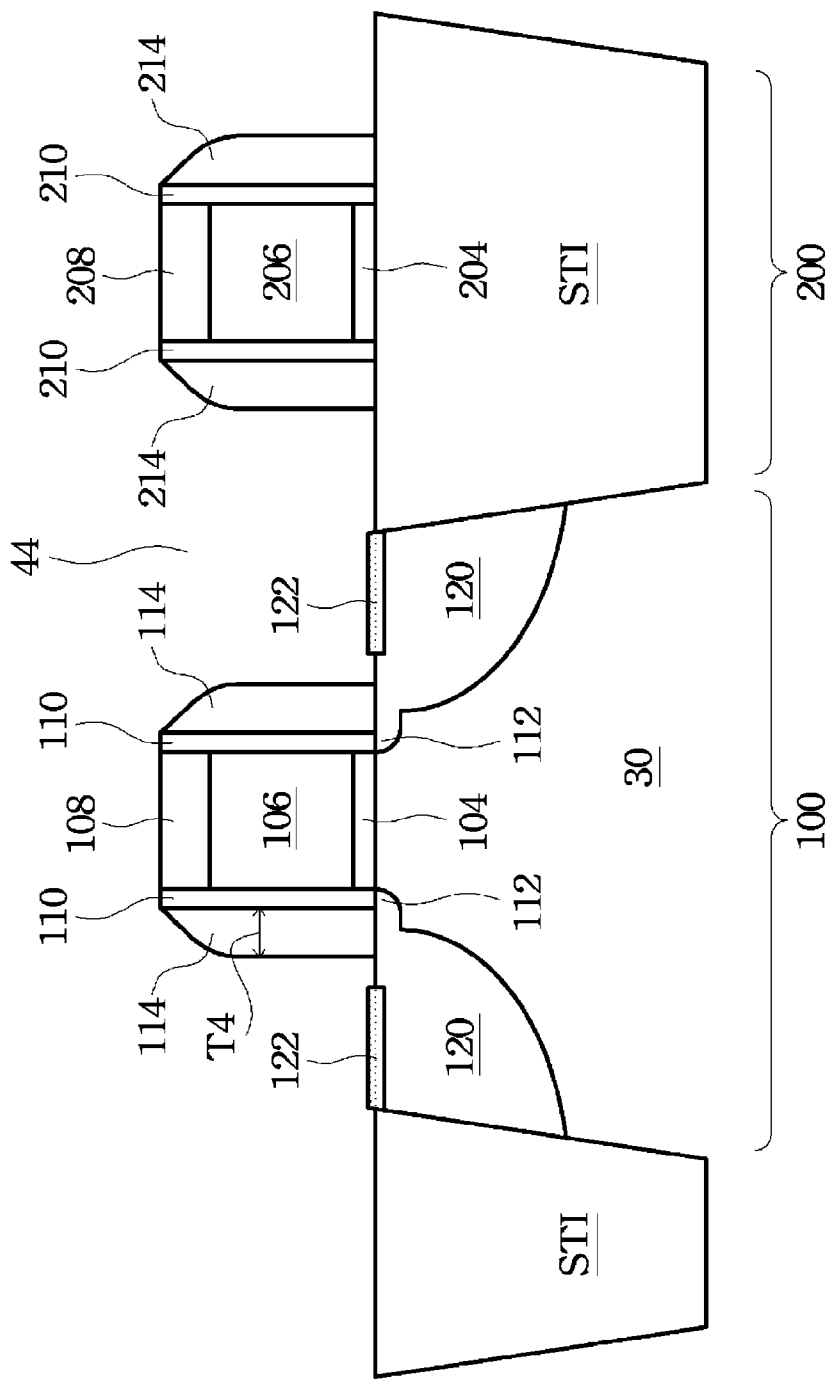

Next, as shown in FIG. 6, gate spacers 114 and 214 are thinned. In an exemplary embodiment, the thinning of gate spacers 114 and 214 is performed using wet etching. As result, the thickness of gate spacers 114 and 214 is reduced from T3 as shown in FIG. 4 to T4 as shown in FIG. 6. In an embodiment, thickness T4 is less than about 90 percent of thickness T3. Also, thickness T4 may be about 50 Å smaller than, thickness T3. After the thinning, the outer edges of gate spacers 114 are spaced apart from the respective inner edges of silicide regions 122. The thinning of gate spacers 114 and 214 causes an advantageous reduction in the aspect ratio of gap 44.

Figure 7:
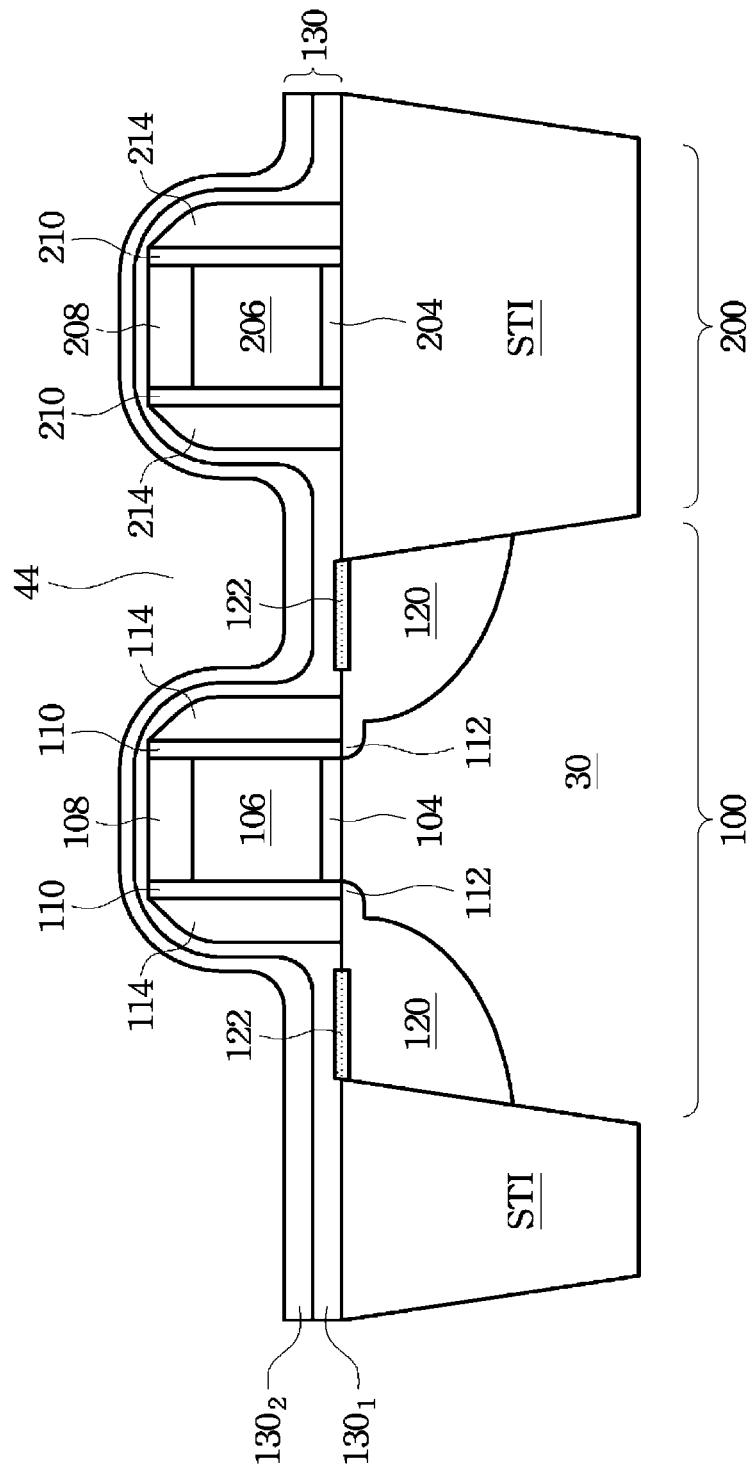

Dielectric layer 130 is then formed over region 100 and region 200, as illustrated in FIG. 7. In the preferred embodiment, dielectric layer 130 is a composite layer comprising first sub-layer $130_1$ and second sub-layer $130_2$. The sub-layers $130_1$ and $130_2$ are preferably formed of materials having different etching characteristics, such as silicon oxide, silicon nitride, silicon oxynitride (SiON), and the like. The formation of the sub-layers $130_1$ and $130_2$ may be performed using commonly used techniques, such as plasma enhanced chemical vapor deposition (PECVD), low-pressure chemical vapor deposition (LPCVD), sub-atmospheric chemical vapor deposition (SACVD), etc. In an exemplary embodiment, sub-layer $130_1$ is a nitride layer and sub-layer $130_2$ is a liner oxide layer. Preferably, dielectric layer 130 has a thickness of less than about 150 Å, and more preferably between about 50 Å and about 150 Å.

Figure 8:
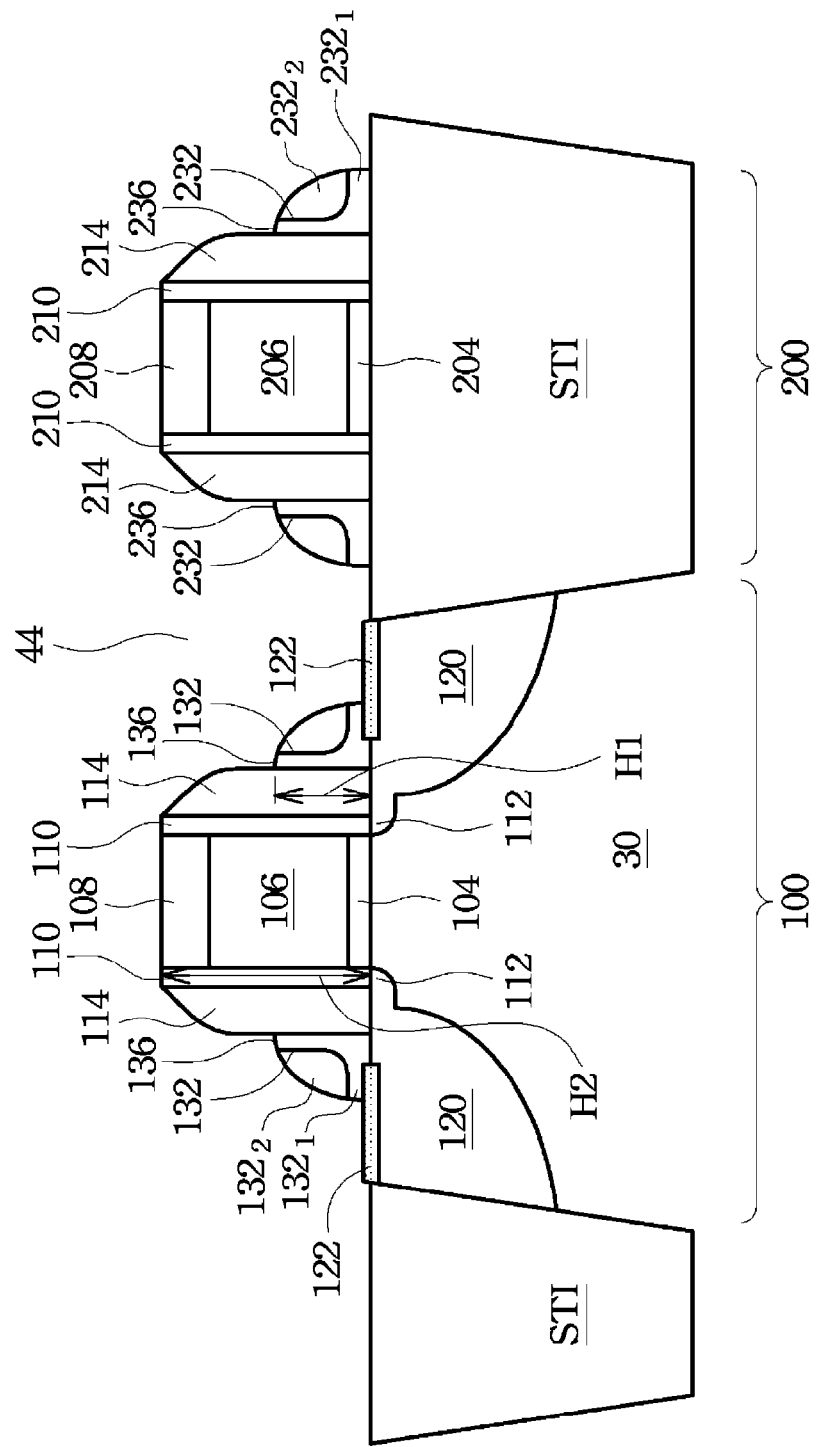

Referring to FIG. 8, dielectric layer 130 is etched, for example, using dry etching, to form secondary spacers 132 and 232. When dielectric layer 130 includes first sub-layer $130_1$ and second sub-layer $130_2$, each of the secondary spacers 132 and 232 includes a first portion $132_1/232_1$ and a second portion $132_2/232_2$ on the first portion $132_1/232_1$. In an exemplary embodiment, the second portions $132_2/232_2$ are formed of silicon oxide, while the first portions $132_1/232_1$ are formed of silicon nitride. Top points 136 and 236 of secondary spacers 132 and 232 are preferably lower than the top edges of spacers 114 and 214, respectively. More preferably, to have an optimized gap-filling effect, height H1 of secondary spacers 132 and 232 is between about 10 percent and about 20 percent of height H2 of spacers 114 and 214. Further, top points 136 and 236 may also be lower than the top surfaces of gate electrodes 106 and 206, respectively. The outer edges of secondary spacers 132 may be spaced apart from, or aligned with, the respective inner edges of silicide regions 122. Alternatively, the outer edges of secondary spacers 132 may reside on the respective silicide regions 122, as shown in FIG. 8.

Figure 9:
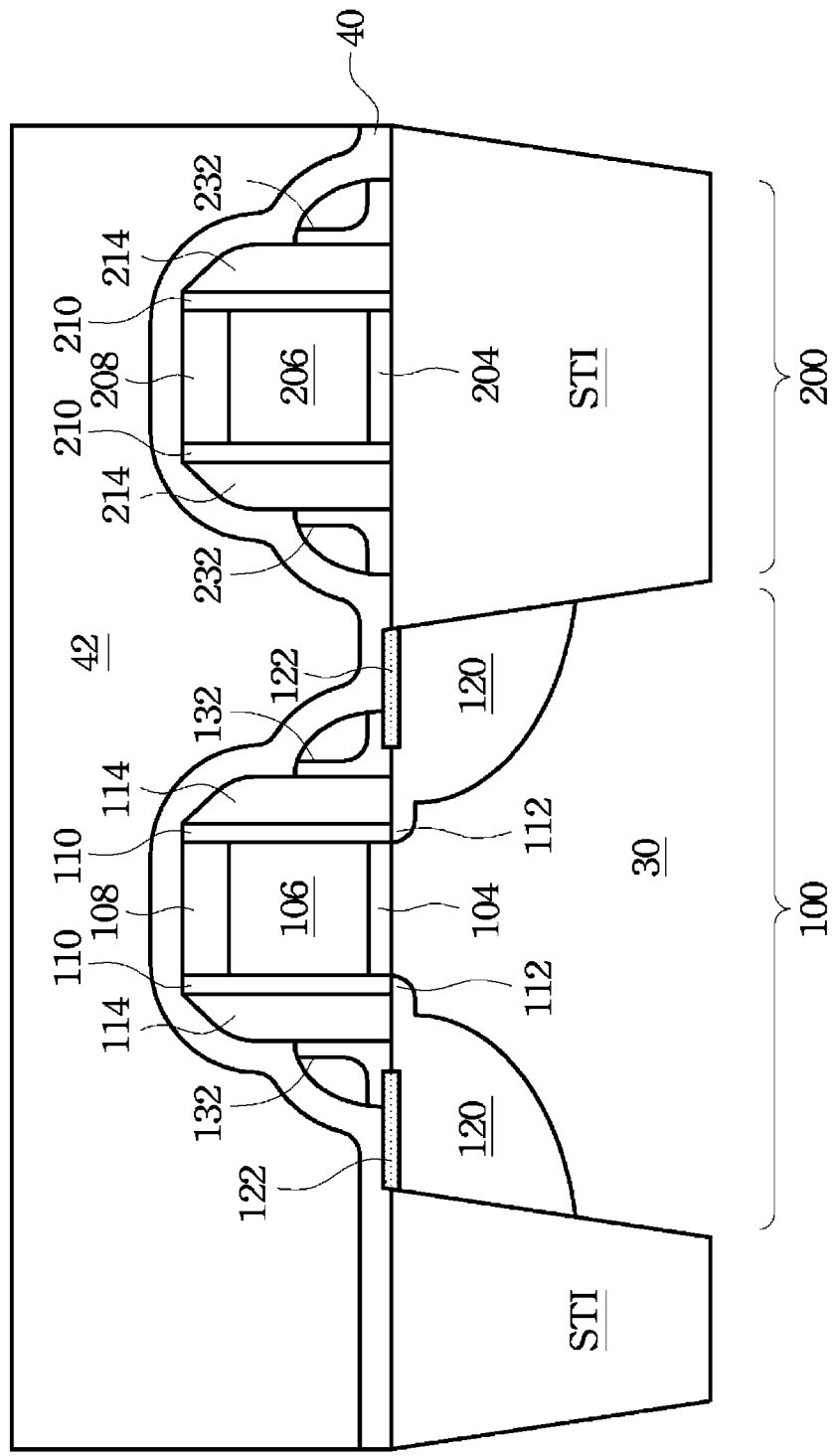

Referring to FIG. 9, contact etch stop layer (CESL) 40 is formed. According to the type of MOS device to be formed, appropriate materials and corresponding formation processes are selected for CESL 40 to apply either compressive or tensile strain to the channel region of the underlying MOS device. The materials of CESL 40 include materials such as nitride, oxynitride, oxide, SiC, SiON, and combinations thereof.

FIG. 9 also illustrates the formation of inter-layer dielectric (ILD) 42, which may be formed of an oxide, a carbon-containing dielectric, boronphosphorous silicate glass (BPSG), phosphorous silicate glass (PSG), spin-on glass (SOG), tetra-ethyl-ortho-silicate (TEOS) oxide, or the like. The formation methods may include high-density plasma chemical vapor deposition (HDPCVD), high-aspect ratio process (HARP), or the like.

Advantageously, due to the formation of secondary spacers 132 and 232, the bottom corner portions of gap 44, which is between remaining portions of gate spacers 114 and 214, are partially filled by CESL 40 prior to the formation of ILD 42. The resulting gap 44 filled by ILD 42 thus has much more sloped sidewalls (which may result in gap 44 having a V-shape) than if no secondary spacers 132 and 232 are formed. Accordingly, the likelihood for voids to be formed in ILD 42 is reduced.

Figure 10:
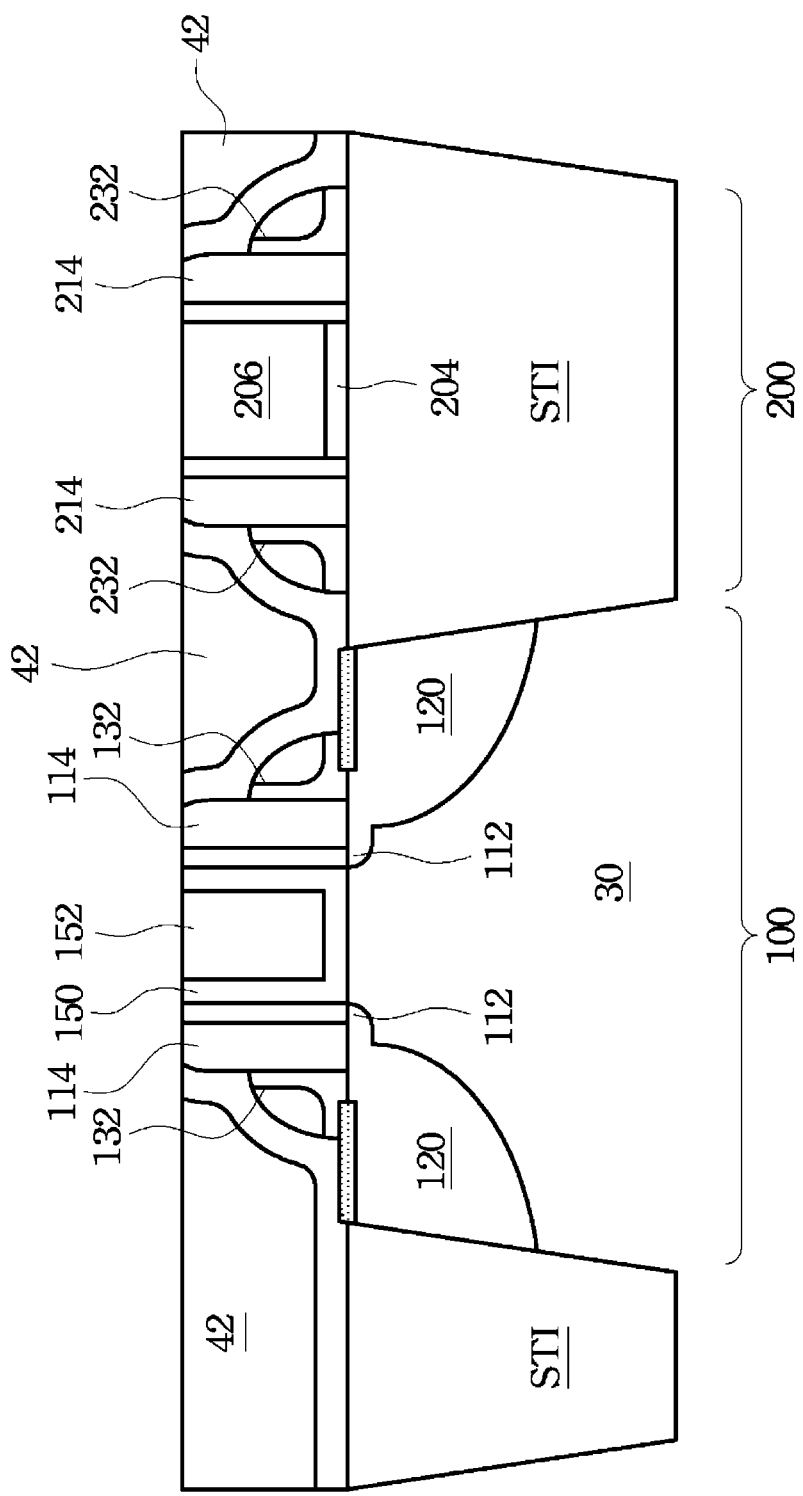

FIG. 10 illustrates the resulting structure after the gate of the MOS device is formed using the gate-last approach. A brief process for forming the structure shown in FIG. 10 is discussed as follows. First, a chemical mechanical polish (CMP) is performed. The CMP stops at the top surfaces of gate electrodes 106 and 206. Accordingly, the top surfaces of CESL 40 and gate spacers 114 and 214 are leveled to the top surfaces of gate electrodes 106 and 206. After the CMP, the top surfaces of gate electrodes 106 and 206 are exposed.

Next, gate electrode 106 and gate dielectric 104 are removed to form an opening (the spaces occupied by features 150 and 152). Next, a gate dielectric layer, preferably formed of a high-k dielectric material, is blanket formed, followed by the filling of a conductive material into the opening. An additional CMP is then performed to remove portions of the gate dielectric layer and the conductive material over ILD 42. The remaining gate dielectric layer and the metallic material in the opening form gate dielectric 150 and gate electrode 152 of the resulting MOS device. Although not shown, gate dielectric 204 and gate electrode 206 may also be replaced using the gate-last approach or may be preserved as they are.

In FIG. 11, additional ILD 56 is formed, followed by the formation of contact plugs 58 in ILD 56. Contact plugs 58 are electrically connected to gate electrode 152 and silicide regions 122.

FIG. 12 illustrates a structure with gates of MOS devices formed using the gate-first approach. In this embodiment, the formation of hard masks 108 and 208 (see FIG. 2) are optional, and gate spacers 114 and 214 may include silicon oxide layers. The formation processes are similar to those shown in FIGS. 2 through 11, except gate electrode 106 and gate dielectric 104 are not replaced by gate electrode 152 and gate dielectric 150, and contacts 58 are formed to electrically connect to gate electrode 106, or the silicide on gate electrode 106.

In the exemplary embodiment discussed in the preceding paragraphs, the gate stack features, including gate dielectric 204 and gate electrode 206, are dummy features formed on an STI region. Alternatively, the gate stack may be used for forming a MOS device, which may share a common source region or a common drain region with the MOS device formed in region 100. In this case, the MOS devices in regions 100 and 200 are closely located, and hence the respective gap-filling with the ILD 42 may also benefit from the thinning of gate spacers 114 and 214 (refer to FIGS. 11 and 12) and from the formation of secondary spacers 132 and 232. One skilled in the art will realize the process steps for achieving the same by applying the teaching provided in the preceding paragraphs.

In the embodiment of the present invention, gate spacers 114 and 214 are thinned to reduce the aspect ratio of gap 44 between gate spacers 114 and 214. Secondary spacers 132 and 232 further make the sidewalls of gap 44 sloped. As a result, the possibility of forming voids in gap 44 during the filling with the ILD 42 is reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor device comprising:
   a semiconductor substrate;
   a gate stack on the semiconductor substrate, wherein the gate stack comprises:
      a gate dielectric comprising a planar bottom portion and sidewall portions; and a gate electrode over the planar bottom portion of the gate dielectric and adjoining the sidewall portions of the gate dielectric, wherein a portion of the gate electrode is level with the sidewall portions of the gate dielectric;

a gate spacer adjacent a sidewall of the gate stack;

a source/drain region adjacent the gate spacer;

a source/drain silicide region on the source/drain region, wherein the source/drain silicide region does not contact any portion of the gate spacer; and a secondary gate spacer having at least a portion horizontally between the source/drain silicide region and the gate spacer, wherein the secondary gate spacer has a top edge lower than a top edge of the gate spacer, and wherein the secondary gate spacer has an outer edge vertically misaligned to an inner edge of the source/drain silicide region.

2. The semiconductor device of claim 1, wherein a portion of the secondary gate spacer overlaps a portion of the source/drain silicide region.

3. The semiconductor device of claim 1, wherein the outer edge of the secondary gate spacer comprises a portion directly over the source/drain silicide region.

4. The semiconductor device of claim 1, wherein the outer edge of the secondary gate spacer is misaligned to an inner edge of the source/drain region.

5. The semiconductor device of claim 1 further comprising a seal layer between and adjoining the gate stack and the gate spacer, wherein a bottom of the gate spacer contacts the semiconductor substrate.

6. The semiconductor device of claim 1, wherein the gate spacer is a single-layer spacer, and the secondary gate spacer comprises a first layer, and a second layer on the first layer, and wherein the first and the second layers comprise different materials.

7. The semiconductor device of claim 6, wherein the gate spacer comprises silicon nitride, and wherein the first and the second layers of the secondary gate spacer comprise silicon nitride and silicon oxide, respectively.

8. The semiconductor device of claim 6, wherein the gate stack comprises a planar gate dielectric, and a gate electrode on the planar gate dielectric.

9. A semiconductor device comprising:
a semiconductor substrate;
a gate stack on the semiconductor substrate, wherein the gate stack comprises:
a gate dielectric comprising a planar bottom portion and a sidewall portion; and
a gate electrode over the planar bottom portion of the gate dielectric, wherein a sidewall of the gate electrode contacts a sidewall of the sidewall portion of the gate dielectric;

a gate spacer adjacent a sidewall of the gate stack;

a source/drain region adjacent the gate spacer;

a source/drain silicide region on the source/drain region, wherein the source/drain silicide region has an inner edge spaced apart from an outer edge of the gate spacer; and a secondary gate spacer having at least a portion horizontally between the inner edge of the source/drain silicide region and the outer edge of the gate spacer, wherein the secondary gate spacer has a top edge lower than a top edge of the gate spacer.

10. The semiconductor device of claim 9, wherein the secondary gate spacer has an outer edge vertically misaligned to the inner edge of the source/drain silicide region.

11. The semiconductor device of claim 10, wherein the outer edge of the secondary gate spacer is vertically misaligned to an inner edge of the source/drain region.

12. The semiconductor device of claim 9 further comprising a contact etch stop layer (CESL) over the secondary gate spacer and the source/drain silicide region, wherein a top edge of the CESL is leveled with a top edge of the gate spacer.

13. The semiconductor device of claim 12 further comprising an inter-layer dielectric over the CESL.

14. The semiconductor device of claim 13 further comprising:
a shallow trench isolation region in the semiconductor substrate and adjoining the source/drain region;
an additional gate stack on the shallow trench isolation region; and
an additional gate spacer on a sidewall of the additional gate stack, wherein the secondary gate spacer and the CESL fills a gap between the gate spacer and the additional gate spacer.

15. The semiconductor device of claim 1 further comprising:
a shallow trench isolation region in the semiconductor substrate and adjoining the source/drain region;
an additional gate stack overlapping the shallow trench isolation region; and
an additional gate spacer on a sidewall of the additional gate stack, wherein the secondary gate spacer is located in a gap between the gate spacer and the additional gate spacer.

* * * * *